United States Patent
Wu et al.

(10) Patent No.: US 10,038,000 B2
(45) Date of Patent: Jul. 31, 2018

(54) MEMORY CELL AND FABRICATING METHOD THEREOF

(71) Applicant: TAIWAN SEMICONDUCTOR MANUFACTURING CO., LTD., Hsinchu (TW)

(72) Inventors: Cheng-Yi Wu, Taichung (TW); Jian-Shin Tsai, Tainan (TW); Kuo-Hsien Cheng, Tainan (TW); Min-Hui Lin, Tainan (TW); Wei-Li Chen, Tainan (TW); Chao-Ching Chang, Kaohsiung (TW); Chung-Yu Hsieh, Tainan (TW); Chin-Szu Lee, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/857,362

(22) Filed: Sep. 17, 2015

(65) Prior Publication Data

US 2017/0084620 A1 Mar. 23, 2017

(51) Int. Cl.
*H01L 27/112* (2006.01)
*H01L 23/525* (2006.01)

(52) U.S. Cl.
CPC .... *H01L 27/11206* (2013.01); *H01L 23/5252* (2013.01)

(58) Field of Classification Search
CPC ............. H01L 27/2436; H01L 29/0847; H01L 29/66545
See application file for complete search history.

(56) References Cited

U.S. PATENT DOCUMENTS

| | | | | |
|---|---|---|---|---|
| 4,665,426 A * | 5/1987 | Allen | ................. | G11C 16/0416 257/323 |
| 7,880,217 B2 * | 2/2011 | Sung | ................. | H01L 29/42324 257/317 |
| 9,236,453 B2 * | 1/2016 | Li | ........................ | H01L 29/7881 |
| 2010/0090321 A1 * | 4/2010 | Mulfinger | ......... | H01L 21/31116 257/632 |
| 2010/0232203 A1 * | 9/2010 | Chung | .................. | G11C 17/16 365/96 |
| 2011/0298061 A1 * | 12/2011 | Siddiqui | ........... | H01L 21/28088 257/410 |
| 2015/0228776 A1 * | 8/2015 | Xie | ........................ | H01L 29/78 257/288 |

* cited by examiner

*Primary Examiner* — Julia Slutsker
(74) *Attorney, Agent, or Firm* — Maschoff Brennan

(57) ABSTRACT

A memory cell includes a selector, a fuse connected to the selector in series, a contact etch stop layer formed on the selector and the fuse, a bit line connected to the fuse, and a word line connected to the selector. The contact etch stop layer includes a high-k dielectric for improving the ability of capturing the electrons, thus the retention time of the memory cell is increased.

20 Claims, 10 Drawing Sheets

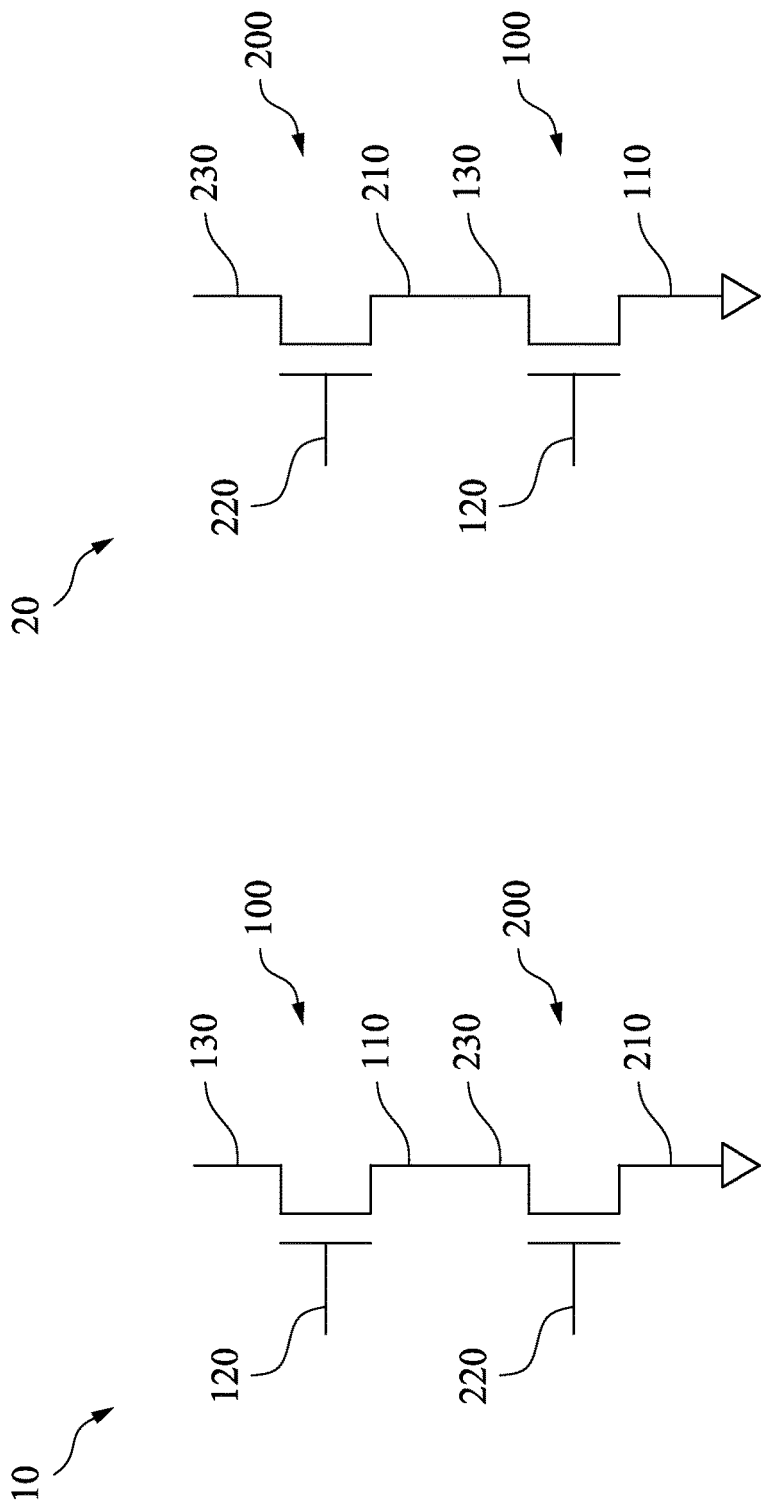

MEMORY CELL AND FABRICATING METHOD THEREOF

BACKGROUND

Most of the computing and electronic devices manufactured nowadays use non-volatile memories for permanent storage of data. In these memories, data is not deleted even after the removal of the power supply. In other words, data once stored in these memories is retained irrespective of the status of the power supply to the memory.

The non-volatile memories include read only memories (ROMs), programmable read only memories (PROMs), erasable programmable read only memories (EPROMs), one-time-programmable (OTP) EPROMs, flash memories, and magneto-resistive read only memories (MRAM). A single non-volatile memory made up of one or more memory arrays, which in turn are made up of many electrically programmable memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic electrical diagram of a memory cell, in accordance with some embodiments of the disclosure.

FIG. 2 is a schematic electrical diagram of a memory cell, in accordance with some embodiments of the disclosure.

DETAILED DESCRIPTION

Figure 3:
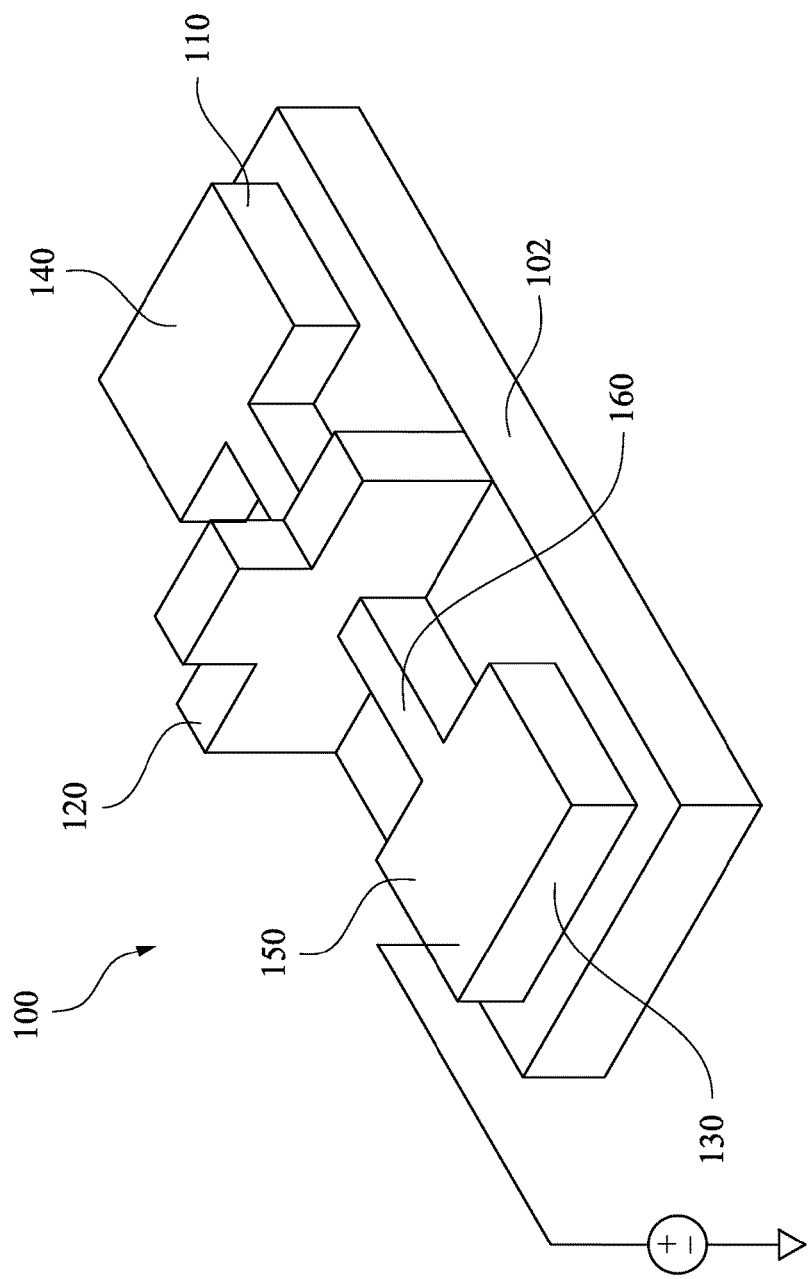
FIG. 3 is a schematic perspective view of the anti-fuse, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One commonly available type of nonvolatile memory is the programmable read-only memory ("PROM"), which uses word line—bit line crosspoint elements such as fuses, anti-fuses, and trapped charge devices such as the floating gate stack avalanche injection metal oxide semiconductor ("FAMOS") transistor to store logical information. PROM typically is not reprogrammable.

In one or more embodiments, a transistor is used as a (anti-) fuse, and its drain and source are considered two terminals of the fuse. For simplicity, "anti-fuse" and "fuse" are used interchangeably in this application. In normal conditions, the fuse (e.g., the transistor) is not operational, its drain and source are not electrically connected. The fuse is therefore open (e.g., its terminals are electrically open). The gate stack of the fuse is then controlled (e.g., to turn off the transistor), and a voltage with appropriate amplitude and duration is applied to the drain of the fuse causing the drain and the source to be electrically shorted. In effect, the two terminals of the fuse are electrically shorted. As a result, the transistor functions as an anti-fuse. In some embodiments, the fuse is used in an OTP memory cell or an OTP memory array.

FIG. 1 is a schematic electrical diagram of a memory cell, in accordance with some embodiments of the disclosure. The memory cell 10 is utilized in a memory array, for example. The memory cell 10 includes a fuse 100 connected in series with a transistor 200, both of which are shown in circuit representation. The fuse 100 includes a source 110, a gate stack 120, and a drain 130. The transistor 200 includes a source 210, a gate stack 220, and a drain 230. The drain 130 of the fuse 100 is connected to a bit line BL. The source 110 of the fuse 100 is connected to the drain 230 of the transistor 200. The gate stack 220 of the transistor 200 is connected to a word line WL, and the source 210 of the transistor 200 is grounded.

The transistor 200 is also referred to herein as a selector or a selector transistor. When transistor 200 is off, it electrically isolates cell 10 from other components (e.g., of a memory array), but when it is on, it enables an electrical path though fuse 100 (e.g., to ground).

Applying a suitable voltage level to the word line WL and the bit line BL allows accessing the status or logic level of cell 10. For example, to read the memory cell 10, the word line WL is selected, which turns on the transistor 200, then the bit line BL is sensed (e.g., by a sense amplifier) to detect the impedance of the fuse 100. If this impedance is high, then the memory cell 10 is regarded as high. Conversely, if this impedance is low, then the memory cell 10 is regarded as low. To program the memory cell 10, the word line WL is selected to turn on the transistor 200. The fuse 100 is then programmed (details thereof would be discussed in FIG. 3). As the fuse 100 is programmed, the memory cell 10 is programmed.

FIG. 2 is a schematic electrical diagram of a memory cell, in accordance with some embodiments of the disclosure. The memory cell 20 also includes a fuse 100 and a selector 200. However, the position of fuse 100 and selector 200, as compared to FIG. 1, has been swapped. That is, the fuse 100 is under (instead of above) selector 200. In this embodiment, when the word line WL is selected, it turns the selector 200 on and creates an electrical path from the bit line BL to the fuse 100. Similar to the operation of the memory cell 10, when the selector 200 is turned on, reading bit line BL reveals the status or logic level of the memory cell 20. If the fuse 100 is open (e.g., having high impedance) then reading bit line BL reveals the high impedance of the fuse 100. As a result, the memory cell 20 is considered as having a high logic. Conversely, if the fuse 100 is shorted (e.g., having low impedance) then reading bit line BL reveals the low impedance of the fuse 100, and the memory cell 20 is considered as having a low logic. To program the fuse 100, the word line WL is also selected to turn on the selector 200 and thus creates an electrical path from the bit line BL to the fuse 100, and the fuse 100 is programmed. Once the fuse 100 is programmed, the memory cell 20 is programmed.

FIG. 3 is a schematic perspective view of the anti-fuse, in accordance with some embodiments of the disclosure. An anti-fuse is a fuse that is normally open (i.e., two terminals of the fuse are open circuit or high impedance). After being programmed, the two terminals of the fuse are electrically shorted allowing a current to flow between the two terminals. For simplicity, an "anti-fuse" in this application is also referred to as a "fuse."

In some embodiments, the fuse 100 is a transistor, which can be a FinFET or a planar transistor. In the relevant description below and for illustration purposes, fuse 100 or transistor 100 are used interchangeably. The fuse (or transistor) 100 includes a substrate 102, a source 110, a gate stack 120, a drain 130, and two contact regions 140 and 150. In accordance with some embodiments, the transistor 100 is symmetrical. That is, a source (e.g., source 110) can be selected to be a drain (e.g., drain 130) while a drain (e.g., drain 130) can be selected to be a source (e.g., source 110). Further, the drain 130 and the source 110 are used as two terminals of fuse 100.

In some embodiments, the gate stack 120 is doped with P implants while the drain 130 and the source 110 are doped with N+ implants. As a result, the gate stack 120, the drain 130, and the source 110 form two PN junctions including one from the gate stack 120 to the drain 130 and another PN junction from the gate stack 120 to the source 110.

Before being programmed, the fuse 100 is off, the drain 130 and the source 110 are open, the impedance between the drain 130 and the source 110 is high, and the fuse 100 is in the open mode. As a result, there is no current flow between the drain 130 and the source 110. After being programmed, the drain 130 and the source 110 are electrically shorted, thus the fuse 100 is in the closed or shorted mode.

To program the fuse 100, the gate stack 120 of the fuse 100 is controlled (e.g., to turn the fuse 100 on or off) and a voltage, e.g., voltage having suitable amplitude and duration is applied to the drain 130. In some embodiments, the transistor 100 is off when the voltage at the gate stack 120 to the source 110 is less than a threshold voltage, e.g., voltage that turns transistor 100 on. In some embodiments, the threshold voltage for transistor 100 is about 0.4V. That is, the transistor 100 is turned on at about 0.4V. As a result, when a voltage applied at the gate stack 120 is less then 0.4V, the transistor 100 is off. When the gate stack 120 is floated or applied with a negative voltage, the transistor 100 is also off because voltage at the gate stack 120 to the source 110 is less than 0.4V. If a voltage applied at gate stack 120 is between about 0.1V to 0.3V, the transistor 100 is said to have a minor turn-on, a depletion region is generated by this gate stack voltage, narrows channel and causes the drain and the source easier to be shorted.

In some embodiments, the amplitude for voltage of programming is in the range of 1.5V to 2.0V, and its programming duration is in the range of 50 to 100 microseconds (uS). Depending on implementations and variations of process technologies, the voltage to control the gate stack 120 (to turn if off, to minor turn it on, etc.) varies. Similarly, the amplitude and duration of the voltage of programming also vary.

When the fuse 100 is being programmed, a current spike occurs under the gate stack 120 and a current flows from the drain 130 to the source 110. This is because junction breakdown occurs at junctions. Excess carriers are induced from the drain 130 through the channel 160 to the source 110. Because of the high-density current that is induced from the drain 130, the temperature at the transistor 100 increases. The high temperature and current spike cause oxide breakdown at the gate stack 120, resulting in the drain 130 and the source 110 to be electrically shorted.

In the above disclosed embodiments, applying voltage of programming to the drain 130 shorts the fuse 100. In further embodiments, applying voltage of programming to the source 110, instead of the drain 130, also shorts the fuse 100. Further, FIG. 3 shows an NMOS transistor 100, but variations and modifications are within the scope of this disclosure. For example, a PMOS instead of an NMOS transistor is used in some embodiments to create an anti-fuse. To turn off a PMOS transistor, however, relevant mechanisms different from those for an NMOS are used, including, for example, connecting the gate stack of the PMOS transistor to a positive voltage, to VDD, etc. Similarly, to minor turn on the PMOS transistor, a negative voltage closer to the negative threshold of the PMOS transistor is used, etc. So that a drain and a source of a PMOS transistor are shorted, a different voltage level and/or duration is/are used to create the depletion region. This disclosure is not limited to any particular mechanism or technology.

FIG. 4A to FIG. 4F are cross-sectional views of different steps of a method for fabricating a memory cell, in accordance with some embodiments of the disclosure. The memory cell can be the memory cell 10 of FIG. 1 or the memory cell 20 of FIG. 2.

Figure 4A:
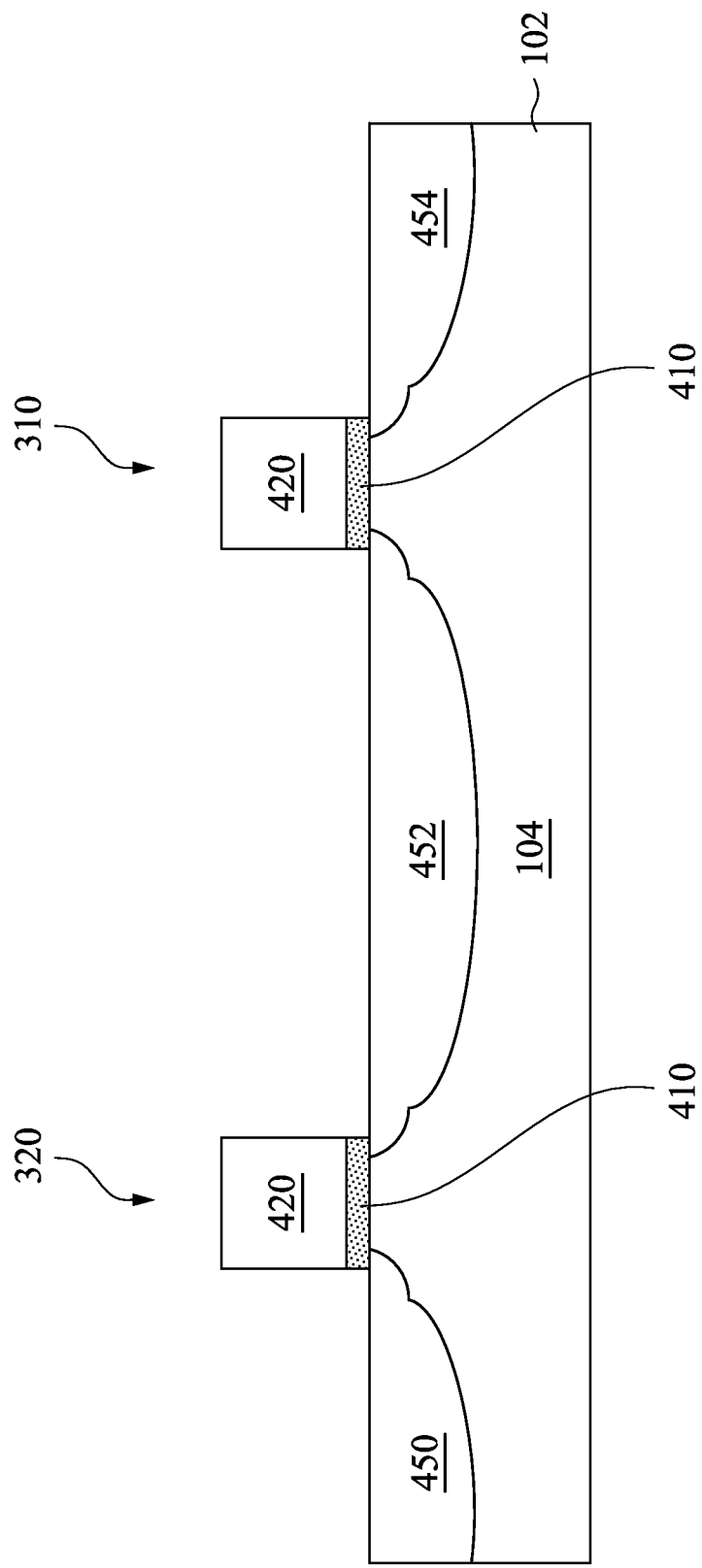
FIG. 4A to FIG. 4F are cross-sectional views of different steps of a method for fabricating a memory cell, in accordance with some embodiments of the disclosure.

Referring to FIG. 4A, a first transistor 310 and a second transistor 320 are formed on a substrate 102. In some embodiments, the substrate 102 includes a bulk silicon substrate. The substrate 102 may be silicon in a crystalline structure. In other embodiments, the substrate 102 may include other elementary semiconductors such as germanium, or include a compound semiconductor such as, silicon carbide, gallium arsenide, indium arsenide, and indium phosphide. In some other embodiments, the substrate 102 includes a silicon-on-insulator (SOI) substrate. The SOI substrate may be fabricated using separation by implantation of oxygen, wafer bonding, and/or other suitable methods.

At least a portion of the substrate 102 is doped with P-type or N-type dopants to form a P-well or an N-well. In some embodiments, the portion of the substrate 102 is doped with N-type dopants, such as P, As, Si, Ge, C, O, S, Se, Te, or Sb, to form an N-well 104 in the substrate 102. The first transistor 310 and the second transistor 320 are formed on the N-well 104.

The source and drain regions 450, 452, 454 are then formed in the substrate 102. The portions of the substrate 102 may be doped to form the source/drain regions 450, 452, 454. The doping processes include using processes such as, ion implantation, diffusion, annealing, and/or other suitable processes. In some embodiments, the source/drain regions 450, 452, 454 may include an epitaxial (epi) silicon (Si) or epi silicon carbide (SiC) for an NMOS device. In some embodiments, the source/drain region 450, 452, 454 may include epi silicon germanium (SiGe) or epi germanium (Ge) for a PMOS device.

A dielectric layer and a conductive layer are sequentially formed on the substrate 102. The dielectric layer and the conductive layer are patterned to cover portions of the substrate 102 for defining the position of the gate stack region of the transistors 310, 320. The dielectric layer can be made of silicon oxide, silicon nitride, silicon oxynitride, silicon carbide, low-dielectric constant dielectric material or a combination thereof. The dielectric layer can be formed by a deposition process, such as an ALD process, a CVD process, or a PVD process. The conductive layer is formed on the dielectric layer. The conductive layer can be formed by a deposition process, such as an ALD process, a CVD process, or a PVD process. The conductive layer can be made of, for example, poly silicon and/or other conductive materials such as metals.

The dielectric layer and the conductive layer are patterned by using a lithography process and at least one etching process. Exemplary etching processes include sputter etching, reactive gas etching, chemical etching and ion milling. In some embodiments, the dielectric layer and the conductive layer are patterned in the same processes. The patterned dielectric layer is utilized as gate stack insulators 410 of the transistors 310, 320. The patterned conductive layer is utilized as gate stacks 420 of the transistors 310, 320. The gate stack insulators 410 are utilized for isolating the gate stacks 420 and the N-well 104. The portions of the N-well 104 under the gate stack insulators 410 are utilized as the channel regions of the transistors 310 and 320. The gate stacks 420 are formed between the source/drain regions 450, 452, 454, respectively.

The source/drain regions 452, 454, and the gate stack 420 therebetween form the first transistor 310. The source/drain regions 450, 452, and the gate stack 420 therebetween form the second transistor 320. The first transistor 310 and the second transistor 320 share the doped region as the source/drain region, such as source/drain region 452, therebetween. The first transistor 310 and the second transistor 320 are electrically connected to each other through the doped region. Namely, the source/drain of the first transistor 310 is connected to the source/drain of the second transistor 320. In some embodiments, the source of the first transistor 310 is connected to the drain of the second transistor 320 at the doped region 452.

Figure 4B:
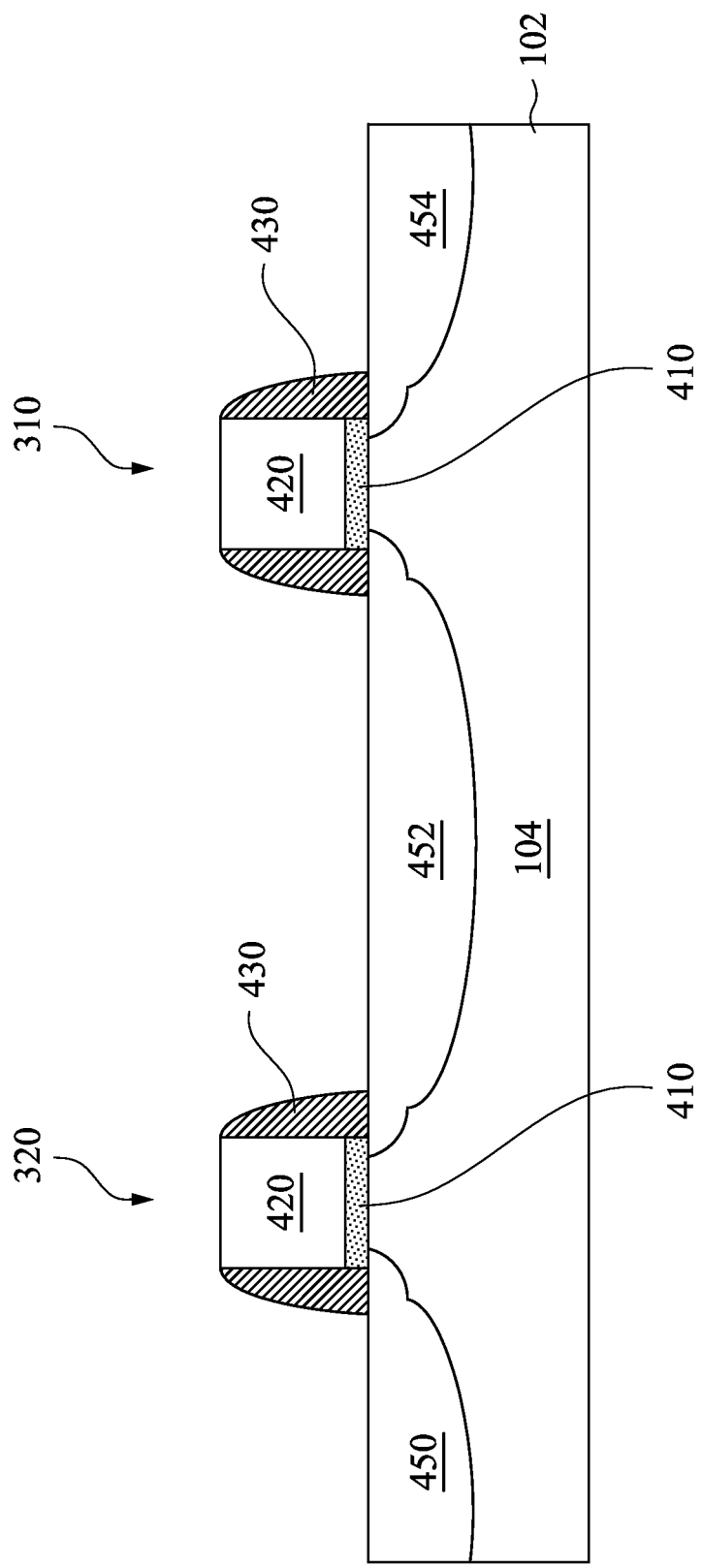

Referring to FIG. 4B, a sidewall spacer 430 is formed beside the gate stack 420. The method of forming the sidewall spacer 430 includes forming a silicon oxide layer on the substrate 102 and then performing an anisotropic etching process to remove a portion of the silicon oxide layer. One or more polishing processes can be optionally performed to flatten the top surface of the gate stack 420 and the sidewall spacer 430.

Figure 4C:
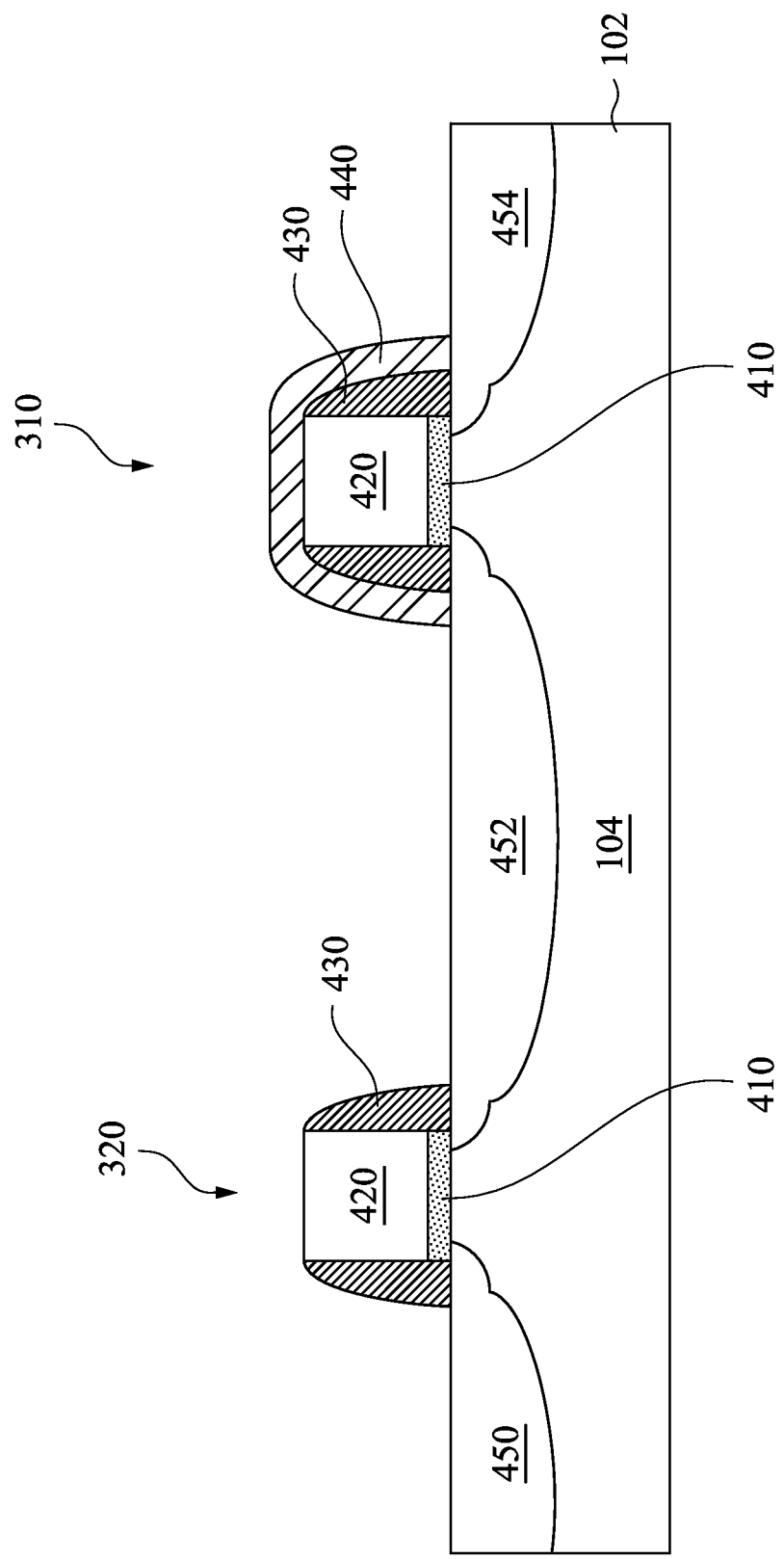

Referring to FIG. 4C, a resist protect oxide 440 is formed on the gate stack 420 of the first transistor 310. The resist protect oxide 440 is formed by processes including depositing an oxide layer on the substrate 102, and patterning the oxide layer. The oxide layer is patterned to form the resist protect oxide 440 covering the gate stack 420 and the sidewall spacer 430 of the first transistor 310.

Figure 4D:
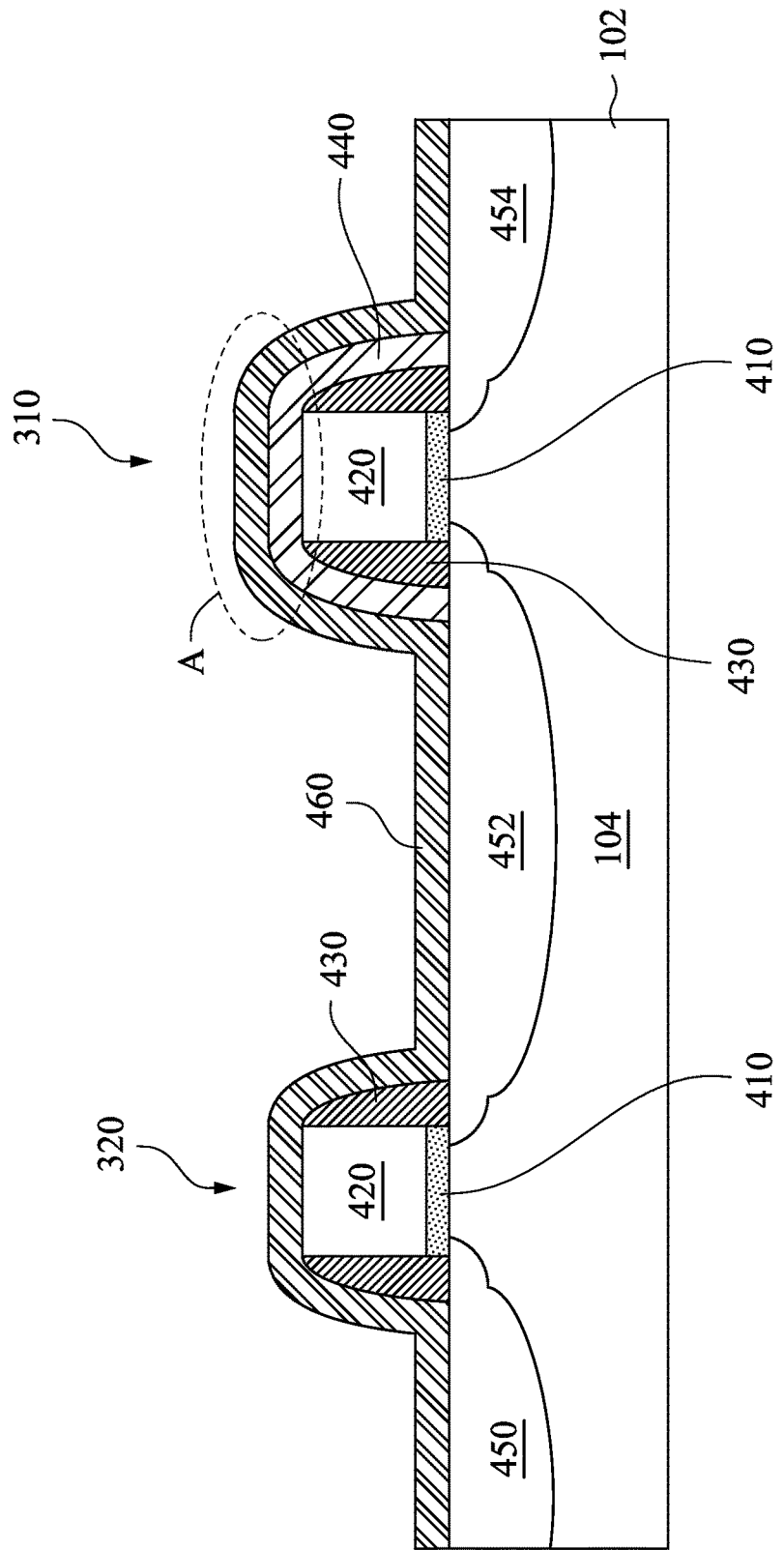

Referring to FIG. 4D, a contact etch stop layer (CESL) 460 is formed on the substrate 102 to cover the gate stacks 420. The contact etch stop layer 460 includes silicon nitride. The contact etch stop layer 460 can be formed by a deposition process, such as an ALD process, a CVD process, a PVD process or a sputter deposition process.

In some embodiments, the doped regions 450, 452, 454 are regarded as silicide regions, and the resist protect oxide 440 is utilized as silicide blocking layer. The resist protect oxide can be utilized to increase/maintain the resistivity of poly resist, such as the contact etch stop layer 460.

In some embodiments, the contact etch stop layer 460 covers the substrate 102, the gate stacks 420, the sidewall spacers 430, and the resist protect oxide 440. However, in order to improve the retention time of the memory cell, the contact etch stop layer 460 of the disclosure includes multi-layers. The contact etch stop layer 460 includes at least one oxide layer and at least one oxide layer. In some embodiments, the oxide layer includes low-k dielectric layer and/or high-k dielectric layer.

Figure 5:
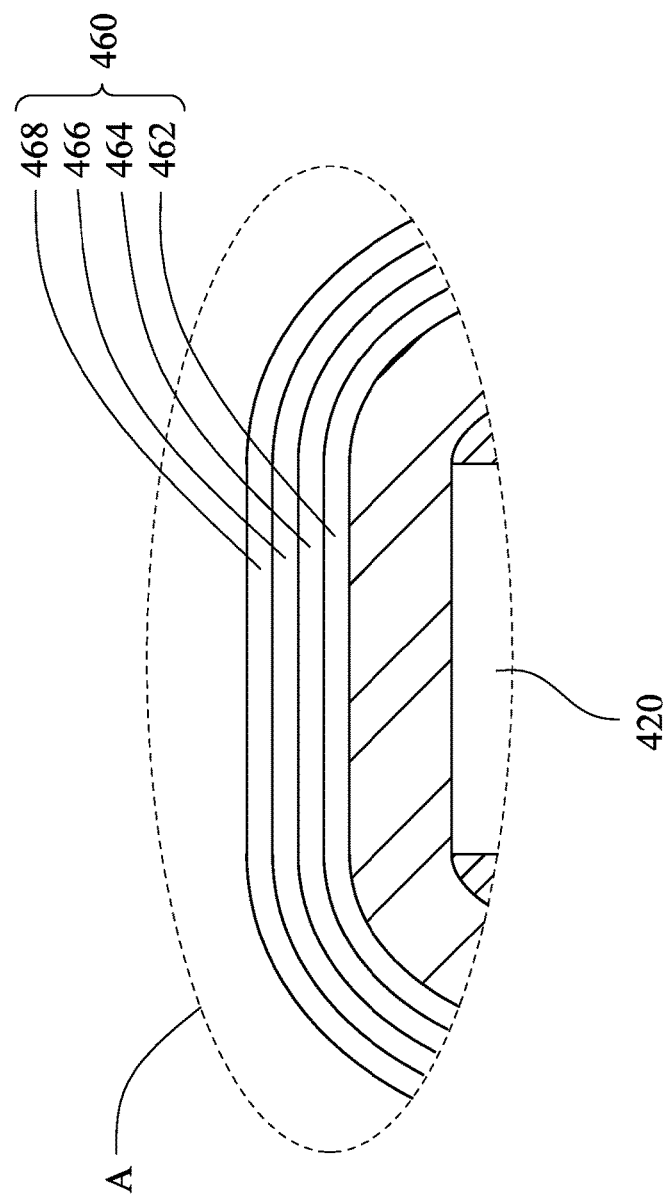
FIG. 5 is an enlarged schematic view of position A in FIG. 4 for illustrating the contact etch stop layer of the memory cell, in accordance with some embodiments of the disclosure.

Reference is made to both FIG. 4D and FIG. 5, in which FIG. 5 is an enlarged schematic view of position A in FIG. 4D for illustrating the contact etch stop layer of the memory cell, in accordance with some embodiments of the disclosure. In some embodiments, the contact etch stop layer 460 includes but is not limited to, from bottom to top, a first dielectric layer 462, a first nitride layer 464, a second dielectric layer 466, and a second nitride layer 468. The first dielectric layer 462, the first nitride layer 464, the second dielectric layer 466, and the second nitride layer 468 are sequentially formed on the substrate 102 by a deposition process, such as an ALD process, a CVD process, or a PVD process.

The first dielectric layer 462 and the second dielectric layer 466 have different dielectric constants. In some embodiments, the dielectric constant of the second dielectric layer 466, which is arranged between the first nitride layer 464 and the second nitride layer 468, is greater than that of the first dielectric layer 462, which is arranged between the substrate 102 and the first nitride layer 464. In some embodiments, the first dielectric layer 462 is made of $SiO_2$, and the second dielectric layer 466 is made of high-k dielectric material having a dielectric constant in a range from about 7 to about 100. For example, the second dielectric layer 466 can be made of a binary or ternary high-k film, such as HfOx. Alternatively, the second dielectric layer 466 is made of a high-k dielectric, such as LaO, AlO, ZrO, $ZrO_2$, TiO, $Ta_2O_5$, $Y_2O_3$, $SrTiO_3$ (STO), $BaTiO_3$ (BTO), BaZrO, HfZrO, $HfZrO_2$, HfLaO, HfSiO, LaSiO, $La_2O_3$, AlSiO, $TiO_2$, HfTaO, HfTiO, $HfO_2$, $(Ba,Sr)TiO_3$ (BST), $Al_2O_3$, oxynitrides, or combinations thereof. Above description is related to some of the embodiments of the disclosure, the layers of the contact etch stop layer 460 may have different lamination structure in some embodiments.

By using the contact etch stop layer 460 including two different oxide layers 462, 466, the ability of capturing the electron in the gate stack 420 of the first transistor 310 can be improved. Namely, the electrons are kept in the gate stack 420 of the first transistor 310, and the bit cell current degradation of the memory cell can be controlled. Thus, the retention time of the memory cell is increased.

Figure 4E:
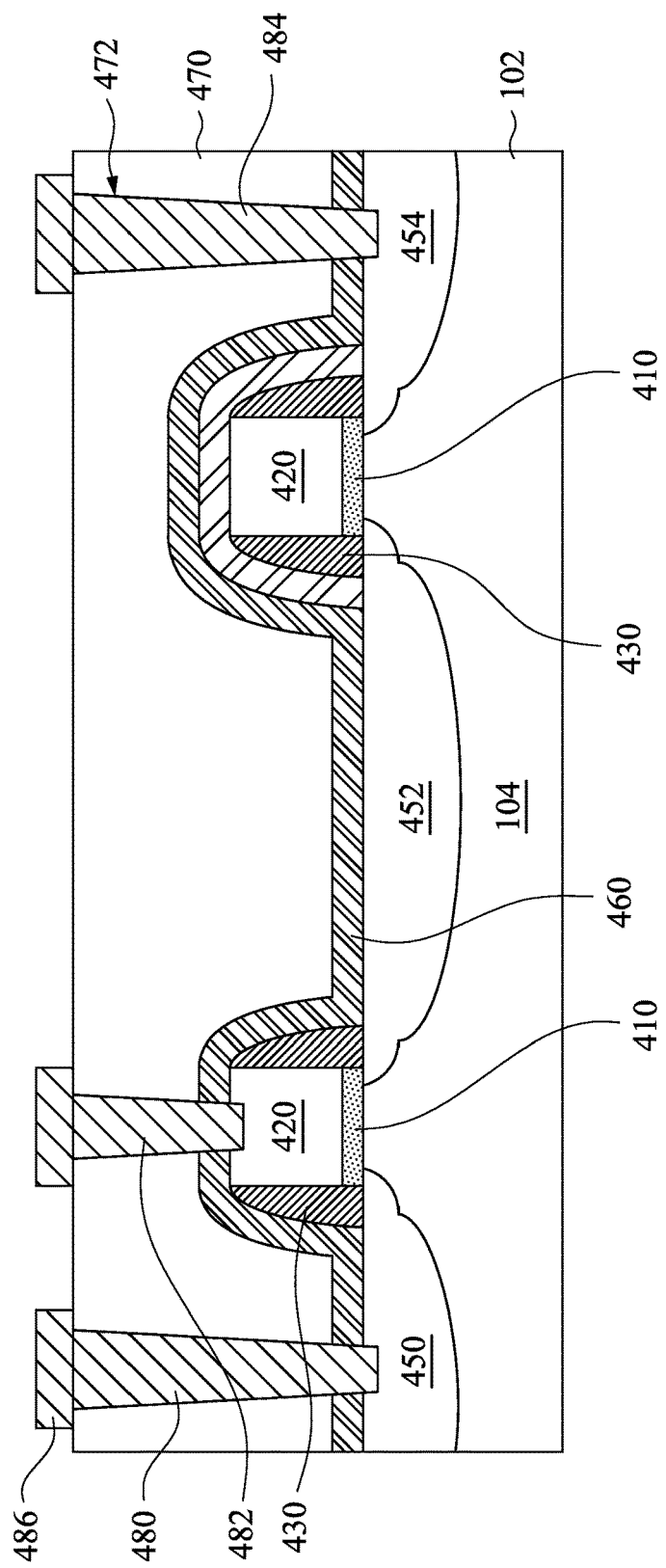

Reference is made to FIG. 4E. After the contact etch stop layer 460 is formed on the substrate 102 and the gate stack 420, an inter-layer dielectric (ILD) layer 470 is formed on the contact etch stop layer 460. The inter-layer dielectric layer 470 is formed by a deposition process, such as an ALD process, a CVD process, or a PVD process. The inter-layer dielectric layer 470 is made of material including silicon oxide, silicon nitride, silicon oxynitride, silicon carbide, low-dielectric constant dielectric material or a combination thereof.

The inter-layer dielectric layer 470 is etched, and a plurality of openings 472 are formed in the inter-layer dielectric layer 470. The openings 472 expose the gate stack 420 of the second transistor 320, and the silicide regions (e.g., the source/drain regions 450, 454), respectively.

A conductive material is deposited, and the openings 472 are filled with the conductive material. The conductive material for example, can be formed by a W, Co, Al, or Cu deposition. Then, the conductive material is polished by, for example, a CMP process, thereby forming a plurality of contact structures 480, 482, 484 in the openings 462.

In some embodiments, the first transistor 310 is utilized as the fuse since the second transistor 320 is utilized as the selector. The contact structure 480 is utilized as a source line (also referring as source line 480), and the source line 480 is connected to the source region 450 of the second transistor 320. The contact structure 482 is utilized as word line (also referring as word line 482), and the word line 482 is connected to the gate stack 420 of the second transistor 320. The contact structure 484 is utilized as bit line (also referring as bit line 484), and the bit line 484 is connected to the drain region 454 of the first transistor 310.

After the contact structures 480, 482, 484 are formed and penetrate the contact etch stop layer 460 to connected to the silicide region and the gate stack, a plurality of electrodes 486 are formed on the contact structures 480, 482, 484 respectively for later interconnection, such as a back end of line (BEOL) process. The electrodes 486 can be made of Cu, Co, Al, or alloy thereof. In some embodiments, the electrodes 486 may have a titanium layer thereon as hydrogen ion catcher.

Figure 4F:
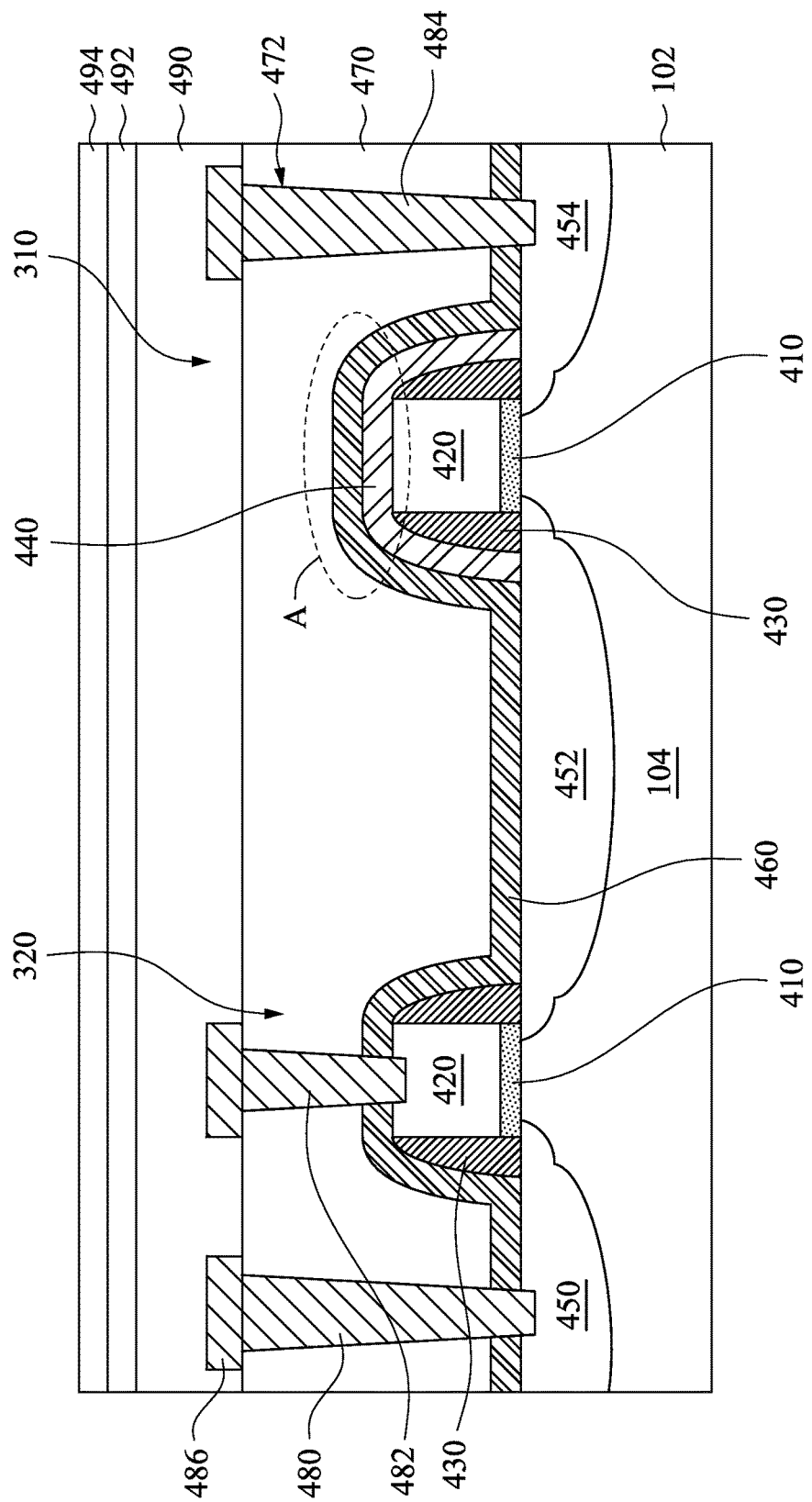

Referring to FIG. 4F, the memory cell may further include another dielectric layer 490 formed on the electrodes 486 and on the inter-layer dielectric layer 470. The top surface of the dielectric layer 490 is flattened for following processes. A passivation layer 492 is formed on the dielectric layer 490. In some embodiments, one or more layers can be formed between the passivation layer 492 and the dielectric layer 490. In some embodiments, the passivation layer 492 is made of an oxide material, a nitride material, and oxide nitride material, etc. In some embodiments, the passivation layer 492 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$).

In some embodiments, the memory cell may optionally include a UV window layer 494 formed on the passivation layer 492. The UV window layer 494 allows UV light, such as 254 nm UV light passing through for erasing memory cell.

Figure 6:
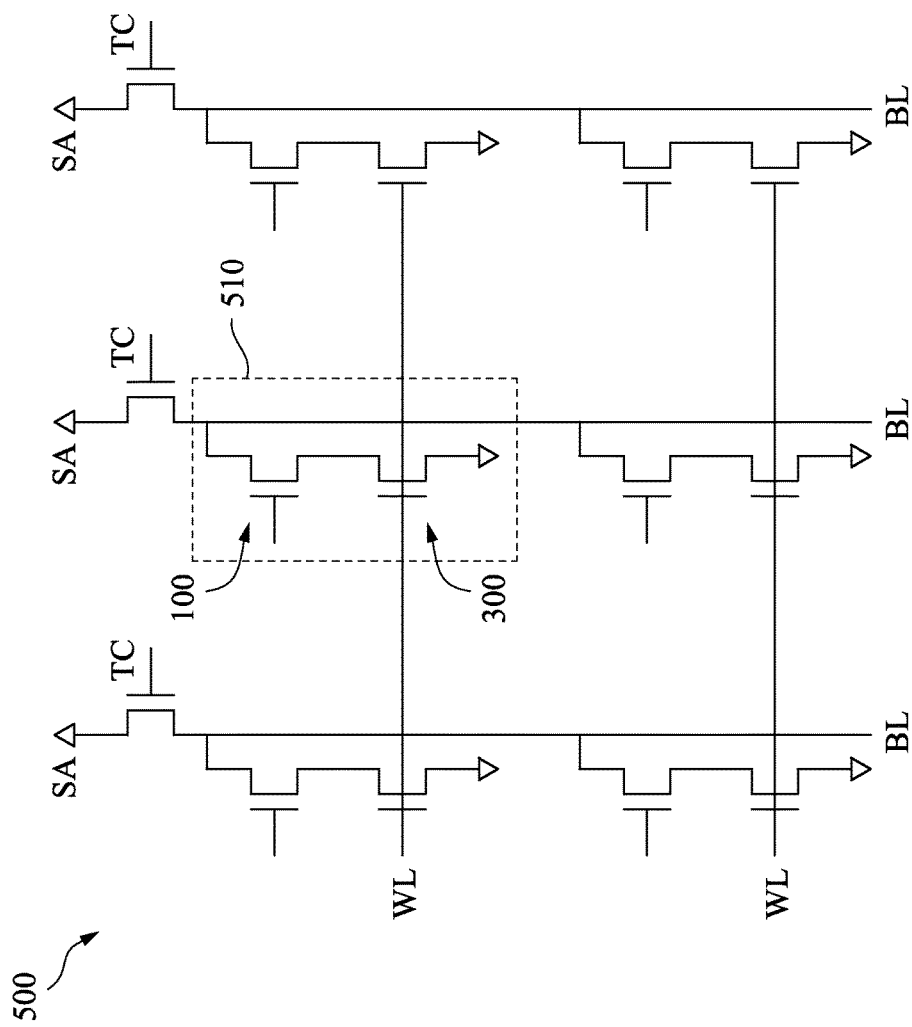
FIG. 6 is a schematic view of the memory array of some embodiments of the disclosure.

Alternatively, a plurality of the memory cells can be arranged in a memory array, as shown in FIG. 6, which is a schematic view of the memory array of some embodiments of the disclosure. The For illustration purposes, memory array 500 includes 2 rows and 3 columns and thus 6 memory cells 510. For simplicity, reference numbers for fuse 100 and transistor 200 and for each gate stack, drain and source of each fuse 100 and selector transistor 200 are not shown.

Sense amplifiers SA in conjunction with transistors TC are used to read the logic level of each memory cell 510. In effect, sense amplifiers SA detect the impedance at nodes or a corresponding cell 510. If the impedance is high, then the corresponding memory cell 510 is high. Conversely, if the impedance is low, then the corresponding memory cell 510 is low.

To read a memory cell 510, a corresponding word line WL and a transistor TC are selected, and a corresponding sense amplifier SA senses the corresponding node. When a word line WL for a memory cell is selected (e.g., turns high), it in turn turns on the corresponding selector 300 for that particular memory cell.

To program a memory cell 510, a corresponding word line WL is selected, and fuse 100 corresponding to that the memory cell 510 is programmed as discussed above. For example, transistor 100 is turned off, and a voltage having appropriate amplitude and period is applied at the corresponding bit line BL. As a result, a current flows from the corresponding BL through the drain and shorts the drain and source of that transistor 100. Once fuse (or transistor) 100 is programmed, the corresponding memory cell 510 is programmed.

Those skilled in the art will recognize that word lines WL may be referred to as X-decoders while bit lines BL may be referred to as Y-decoders. Further, the memory array 500 is shown to have 6 memory cells for illustration only, other embodiments include memory arrays having different configurations with different numbers of the memory cells, rows and columns, and the operation of such memory arrays is apparent to a person of ordinary skill in the art from the above examples. Additionally, variations of memory cells 510 are used in memory arrays in accordance with one or more embodiments. The instant disclosure is not limited to any particular configuration or variation of a memory cell/array.

A number of embodiments have been described. It will nevertheless be understood that various variations and/or modifications may be made without departing from the spirit and scope of this disclosure. For example, different process technologies (MOS, NMOS, PMOS, etc.) may be used to form a fuse and different memory cells may be used to form a memory array having different configurations than those used as particular examples in this application.

According to some embodiments of the disclosure, the memory cell includes a first transistor as a fuse, a second transistor as a selector, and a contact etch stop layer covering the first transistor and the second transistor. The contact etch stop layer includes a high-k dielectric layer for improving the ability of capturing the electrons, thus the retention time of the memory cell is increased.

In some embodiments, a memory cell includes a selector, a fuse connected to the selector in series, a contact etch stop layer having a high-k dielectric layer formed on the selector and the fuse, a bit line connected to the fuse, and a word line connected to the selector.

In some embodiments, a memory cell includes a first transistor, a second transistor serially connected to the first transistor, and a contact etch stop layer formed on the first transistor and the second transistor, wherein the contact etch stop layer includes a first dielectric layer, a second dielectric layer having a dielectric constant greater than that of the first dielectric layer, and a first nitride layer disposed between the first dielectric layer and the second dielectric layer.

In some embodiments, a method for fabricating a memory cell includes forming a first transistor and a second transistor on a substrate, wherein the first transistor is serially connected to the second transistor, and forming a contact etch stop layer on the first transistor and the second transistor, wherein the contact etch stop layer comprises a high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
   a selector;
   a fuse connected to the selector in series;
   a contact etch stop layer comprising: a first nitride layer that covers a top surface and side surfaces of a gate stack of the fuse, a second nitride layer, and a high-k dielectric layer between the first nitride layer and the second nitride layer;
   a bit line connected to the fuse; and
   a word line connected to the selector.

2. The memory cell of claim 1, wherein the selector and the fuse are transistors.

3. The memory cell of claim 2, wherein a source of the fuse is connected to a drain of the selector, and the bit line is connected to a drain of the fuse.

4. The memory cell of claim 2, wherein the word line is connected to a gate stack of the selector, and the memory cell comprises a source line connected to a source of the selector.

5. The memory cell of claim 1, wherein the contact etch stop layer further comprises:
   a dielectric layer between the first nitride layer and the top surface of the gate stack of the fuse.

6. The memory cell of claim 1, further comprising:
   a resist protect oxide disposed between the fuse and the contact etch stop layer.

7. The memory cell of claim 1, further comprising:
   an inter-layer dielectric layer formed on the contact etch stop layer; and
   a passivation layer formed on the inter-layer dielectric layer.

8. The memory cell of claim 7, wherein the bit line and the word line penetrate the inter-layer dielectric layer for connecting to the fuse and the selector, respectively.

9. The memory cell of claim 8, further comprising:
   a UV window layer formed on the passivation layer.

10. A memory cell comprising:
    a first transistor;
    a second transistor serially connected to the first transistor; and
    a contact etch stop layer comprising: a first dielectric layer, a second dielectric layer that has a dielectric constant greater than that of the first dielectric layer and that covers a top surface of a gate stack of the first transistor, a first nitride layer that is disposed between the first dielectric layer and the second dielectric layer and that covers the top surface and side surfaces of the gate stack of the first transistor, and a second nitride layer over the second dielectric layer.

11. The memory cell of claim 10, wherein the first dielectric layer is disposed between the first nitride layer and the first and second transistors.

12. The memory cell of claim 10, wherein the first dielectric layer is an oxide layer, and the second dielectric layer is a high-k dielectric layer.

13. The memory cell of claim 10, wherein the first transistor comprises:
    a source and a drain;
    a channel disposed between the source and the drain, wherein the gate stack is disposed on the channel; and
    at least one sidewall spacer disposed on at least one sidewall of the gate stack, wherein the contact etch stop layer covers the gate stack, the source, the drain, and the sidewall spacer.

14. The memory cell of claim 10, further comprising:
    a resist protect oxide disposed between the first transistor and the contact etch stop layer.

15. A method for fabricating a memory cell, the method comprising:
    forming a first transistor and a second transistor on a substrate, wherein the first transistor is serially connected to the second transistor;
    forming a first nitride layer over top and side surfaces of gate stacks of the first and second transistors;
    forming a high-k dielectric layer over the first nitride layer; and
    forming a second nitride layer over the high-k dielectric layer on the top surfaces of the gate stacks of the first and second transistors.

16. The method of claim 15, further comprising:
    forming a dielectric layer on the first transistor and the second transistor before forming the first nitride layer.

17. The method of claim 15, further comprising:
    forming an inter-layer dielectric layer over the second nitride layer;
    forming a bit line in the inter-layer dielectric layer and connected to the first transistor; and
    forming a word line in the inter-layer dielectric layer and connected to the second transistor.

18. The method of claim 17, further comprising:
    forming a resist protect oxide over the first transistor before forming the first nitride layer.

19. The memory cell of claim 1, wherein the high-k dielectric layer has a portion over the top surface of the gate stack of the fuse.

20. The memory cell of claim 1, wherein the second nitride layer has a portion over the top surface of the gate stack of the fuse.

* * * * *